US006509760B2

(12) United States Patent
Darzy

(10) Patent No.: US 6,509,760 B2
(45) Date of Patent: Jan. 21, 2003

(54) CIRCUIT FOR PROVIDING A CONTROL SIGNAL

(75) Inventor: Saul Darzy, Edgware (GB)

(73) Assignee: STMicroelectronics Limited, Bristol (GB)

( * ) Notice: Subject to any disclaimer, the term of this patent is extended or adjusted under 35 U.S.C. 154(b) by 0 days.

(21) Appl. No.: 09/779,904

(22) Filed: Feb. 8, 2001

(65) Prior Publication Data

US 2001/0015660 A1 Aug. 23, 2001

(30) Foreign Application Priority Data

Feb. 15, 2000 (GB) .............................................. 0003499

(51) Int. Cl.$^7$ ................. H03K 19/0175; H03K 19/094; H03K 5/08
(52) U.S. Cl. .......................... 326/83; 326/112; 327/309
(58) Field of Search ........................ 326/82–83, 86–87, 326/112, 119; 327/309, 321

(56) References Cited

U.S. PATENT DOCUMENTS

| 4,612,457 A | | 9/1986 | Prater | |
|---|---|---|---|---|
| 5,117,129 A | * | 5/1992 | Hoffman et al. | 326/13 |
| 5,179,300 A | * | 1/1993 | Rolandi et al. | 326/83 |
| 5,426,383 A | * | 6/1995 | Kumar | 326/119 |
| 5,432,463 A | | 7/1995 | Wong et al. | 326/32 |
| 5,440,182 A | * | 8/1995 | Dobbelaere | 326/38 |
| 5,442,304 A | | 8/1995 | Wong et al. | 326/17 |
| 5,568,068 A | * | 10/1996 | Ota et al. | 326/82 |
| 6,100,718 A | * | 8/2000 | Blaud et al. | 326/86 |

FOREIGN PATENT DOCUMENTS

| JP | 63119323 A | * | 5/1988 | 326/15 |
|---|---|---|---|---|

OTHER PUBLICATIONS

Standard Search Report from the British priority application filed Feb. 15, 2000.
Patent Abstracts of Japan, vol. 012, No. 367 (E–664), Sep. 30, 1988 & JP 63 119323 May 24, 1988.
Patent Abstracts of Japan, vol. 015, No. 139 (E–1053), Aug. 15, 1995 & JP 03 019423 Jan. 28, 1991.

* cited by examiner

*Primary Examiner*—Michael Tokar
*Assistant Examiner*—James A Cho
(74) *Attorney, Agent, or Firm*—Wolf, Greenfield & Sacks, P.C.; James H. Morris; Robert A. Skrivanek, Jr.

(57) ABSTRACT

A circuit for providing a control signal for a load includes a first switch having a first and a second state, a second switch having a first and a second state coupled to said first switch, a load connected to said first and second switches, protection circuitry for protecting said load from excessive voltage and circuitry for switching said first switch. The circuit is arranged so that when the first switch is in the first state current flows from the load to the first switch and the switching circuitry is arranged to switch the first switch to the second state when the voltage across the load reaches a predetermined value.

27 Claims, 2 Drawing Sheets

CIRCUIT FOR PROVIDING A CONTROL SIGNAL

The present invention relates to a circuit and in particular, but not exclusively for use as an output buffer which drives a high voltage field effect transistor.

A simple output buffer is shown in FIG. 1. In this known circuit, the supply voltage $V_{DD}$ is assumed to be less than the maximum gate to source voltage $V_{GS}$ of a switching PMOS transistor A. A first and a second switching transistor 2 and 4 are connected in series. The first transistor 2 is a P channel field effect transistor with its source connected in series to the drain of the second transistor 4 which is an N channel field effect transistor. The source of the N channel transistor 4 is connected to ground and the source of the P channel transistor 2 is connected to the supply voltage $V_{DD}$. The drain of the P channel transistor 2 and the drain of the N channel transistor 4 are connected to a load 6. The load 6 (which represents the gate of the switching transistor A) in this case is represented by a capacitive load connected between the drain of the N channel transistor 4 and the ground.

The gates of both the N channel transistor 4 and the P channel transistor 2 are connected to a respective control voltage $V_i'$ and $V_i$. $V_i'$ and $V_i$ have the same logic value. In other words, $V_i'$ and $V_i$ are usually logic level high or low at the same time and usually change state at the same time. $V_i'$ and $V_i$, are often generated separately. The control circuitry which controls the signals $V_i'$ and $V_i$ is well-known and, therefore, is not shown. Unless otherwise stated, $V_i'$ and $V_i$ will be generically called $V_i$ hereinafter.

When $V_i$ is in a logic low state, the P channel transistor 2 is switched on and the N channel transistor 4 is switched off. This allows current to flow into the load 6 from the supply $V_{DD}$ via the first P channel transistor 2. This current is termed source current. As the source current flows, the voltage developed across the load 6 increases. The source current will flow whilst there is potential difference between the supply and load 6. In other words, the source current will stop flowing when the supply voltage $V_{DD}$ is equal in magnitude to the voltage across the load 6. At this time, the current supplied by the supply $V_{DD}$ will be zero.

When $V_i$ is in a logic high state, the N channel transistor 4 is switched on and the P channel transistor 2 is switched off. This allows current to flow from the load 6 through the N channel transistor 4 to ground. This current is termed sink current. As the sink current flows out of the load 6 to ground, the voltage developed across the load 6 drops. The sink current flows until the voltage developed across the load 6 is equal to zero volts.

One problem with the circuit shown in FIG. 1 is that in high voltage situations, the supply voltage $V_{DD}$ cannot be assumed to be less than the maximum gate to source voltage of the P channel transistor A. In this case, additional circuitry is added between the load 6 and the supply voltage $V_{DD}$. This additional circuitry needs to maintain a voltage between the drain and source of the P channel transistor A, which is equal to or less than the maximum gate to source voltage of the P channel transistor A. This additional circuitry is called a voltage clamp 8 and is shown in FIG. 2.

With the addition of the voltage clamp 8 between the load 6 and the supply voltage $V_{DD}$, the minimum output voltage which can be developed across the load 6, will be the difference between the supply voltage $V_{DD}$ and the voltage $V_{CLAMP}$ which is dropped across the clamp 8.

With the circuit shown in FIG. 2, when $V_i$ is in a low logic state, the P channel transistor 2 is switched on and the N channel transistor 4 is switched off. The source current will flow from the supply $V_{DD}$, through the P channel transistor 2 and into the load 6. As the source current flows into the load 6, the voltage developed across the load 6 increases. When the voltage developed across the load 6 reaches a value which is equal in magnitude to the supply voltage $V_{DD}$, the source current will cease flowing.

When $V_i$ is in a high logic state, the N channel transistor 4 is switched on and the P channel transistor 2 is switched off. The load 6 will now begin to discharge through the N channel transistor 4 to ground. As the load 6 discharges, the voltage across the load 6 decreases. When the load 6 reaches a value which is equal in value to the difference between the supply voltage $V_{DD}$ and the clamp voltage $V_{CLAMP}$, the sink current, which was supplied from the load 6, is now supplied by the supply voltage $V_{DD}$ and flows through the clamp 8. The sink current flows from the supply $V_{DD}$ through the N channel transistor 4 to ground until $V_i$ changes to a low logic state. $V_i$ changing to a low logic state switches the P channel transistor 2 on and the N channel transistor 4 off.

This excess sink current flowing from the supply $V_{DD}$ leads to an excessively high power dissipation within the circuit and this increased power dissipation is currently taken into account when designing an output buffer. The excess power dissipation is due to sink current flowing from the voltage supply $V_{DD}$ through the clamp 8 and the N channel transistor 4 to ground after the voltage of the load 6 reaches the value of $V_{DD}-V_{CLAMP}$. This power dissipation is disadvantageous because it increases power consumption within the circuit.

It is an aim of embodiments of the invention to address the disadvantages of the known arrangements, and reduce the power dissipation.

According to a first aspect of the invention, there is provided a circuit for providing a control signal for a load comprising a first switch having a first and a second state, a second switch having a first and a second state coupled to said first switch; a load connected to said first and second switches; protection circuitry for protecting said load from excessive voltage; and circuitry for switching said first switch, said circuit being arranged so that when said first switch is in the first state, current flows from the load to said first switch, said switching circuitry being arranged to switch said first switch to said second state when the voltage across the load reaches a predetermined value.

For a better understanding of the present invention, and as to how the same may be carried into effect, reference is made by way of example to the following drawings, in which.

Figure 1:
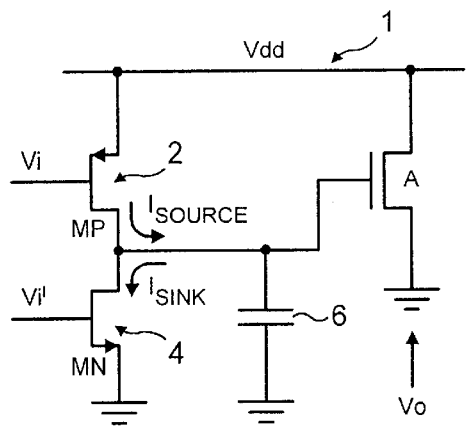
FIG. 1 shows a schematic diagram of a simple output buffer.

An embodiment of the present invention will now be described with reference to FIGS. 3 and 4 which shows an output buffer. Reference will first be made to FIG. 3. Those parts of the circuit which are the same as FIGS. 1 and 2 are marked by the same reference numerals.

Figure 2:
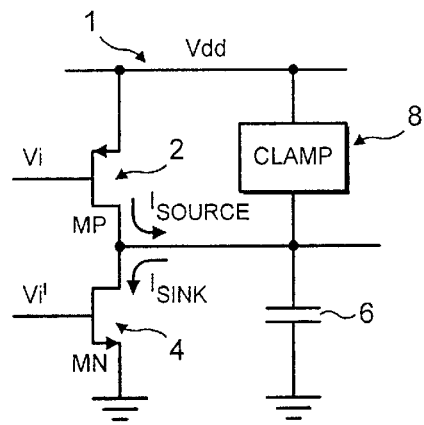
FIG. 2 shows a schematic diagram of the output buffer of FIG. 1 with the voltage clamp.
Figure 3:
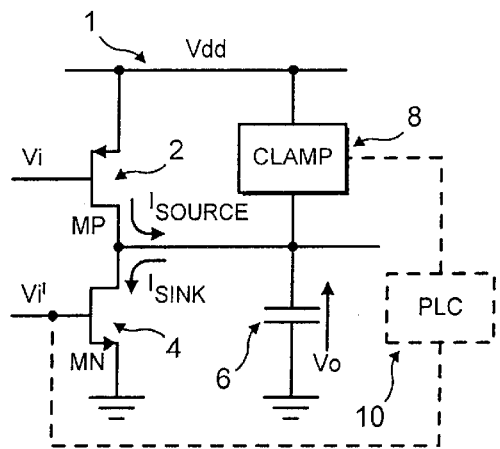
FIG. 3 shows a block diagram of an output buffer embodying the invention.

The arrangement of FIG. 3 has all the components of the arrangement of FIG. 2 and additionally a power limiting circuit (PLC) 10 arranged between the voltage clamp 8 and the gate of the N channel transistor 4. The PLC 10 is arranged to sense the current flowing through the clamp 8, and control the flow of excessive current so that it is at a minimum. Once the voltage at the load 6 (which represents the gate of transistor A) is less than $V_{DD}$ by $V_{CLAMP}$, any sink current flowing through the N channel transistor 4 to ground is supplied by the voltage source $V_{DD}$. The PLC 10 senses the current supplied by $V_{DD}$ flowing through the clamp 8 and the N channel transistor 4 to ground. When the sink current is supplied by the voltage source, the PLC 10 is arranged to switch the state of $V_i'$, which is the input to the gate of the N channel transistor 4, to a low logic level thus switching the N channel transistor 4 off. Switching the N channel transistor 4 off will stop the flow of sink current through the clamp 8 from the voltage supply $V_{DD}$ thus leading to a reduction in power dissipation. The logic state of $V_i$ that is, the voltage on the P channel transistor 2 will remain high at this time.

Figure 4:
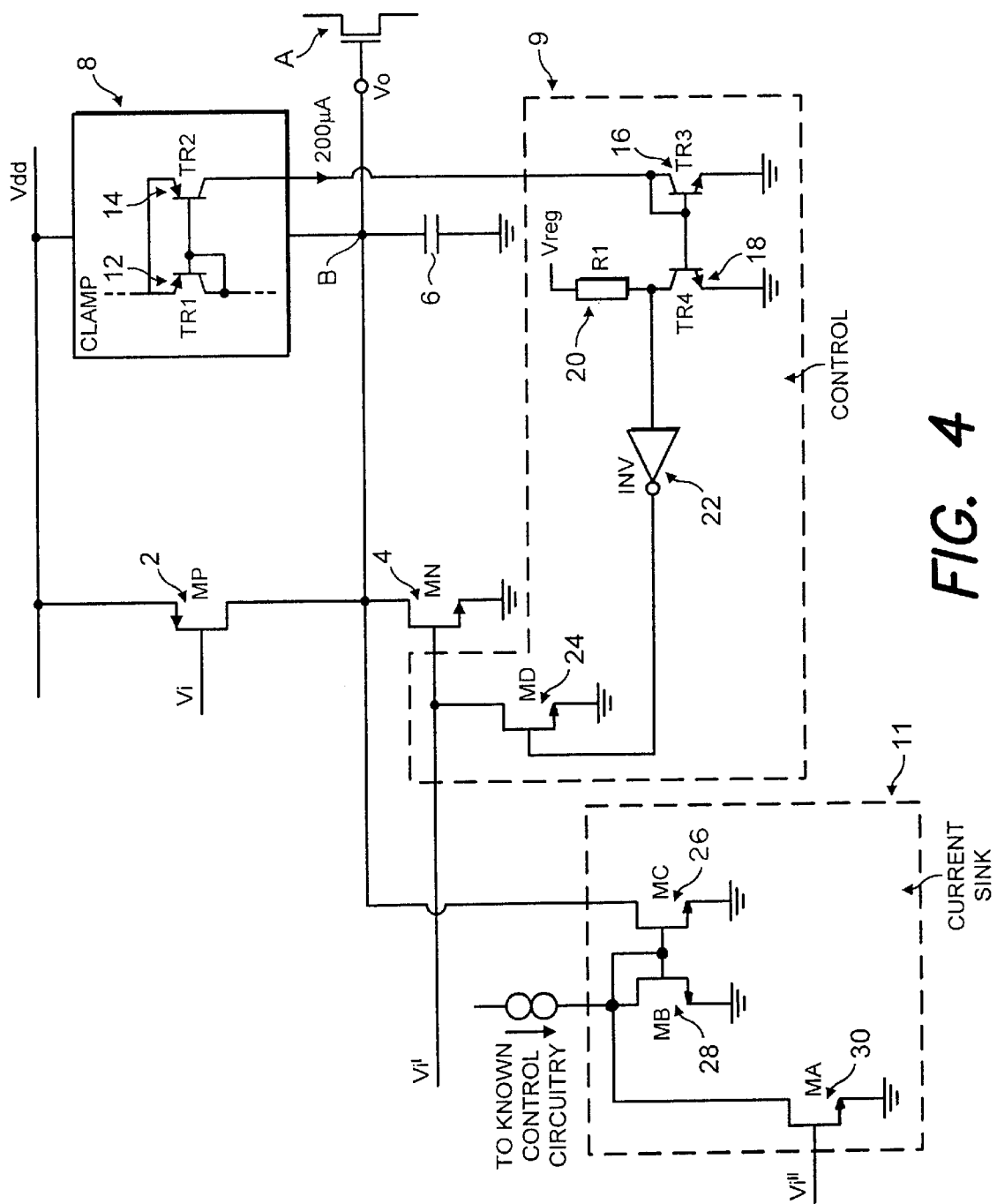
FIG. 4 shows the output buffer of FIG. 3 in more detail.

Reference will now be made to FIG. 4 which shows the construction of the circuit in more detail. In particular, the construction of the clamp 8 and PLC 10 are shown in more detail. Referring first to the clamp 8, this comprises a first and a second PNP transistor 12 and 14 respectively connected in a current mirror arrangement. The emitters of the first and second clamp transistors 12 and 14 are connected together. Additionally, the base of both the first and second clamp transistors 12 and 14 are connected together with the collector of the first clamp transistor 12 being connected to the base of the first clamp transistor 12. This current mirror arrangement allows the same current to flow through the collector of both the clamp transistors 12 and 14. This allows, as described previously, the current through the voltage clamp 8 to be sensed by the PLC 10.

When $V_i$ is in a low logic state, the P channel transistor 2 is switched on and the N channel transistor 4 is switched off. The source current initially flows from the supply $V_{DD}$ through the P channel transistor 2 and into the load 6 as described previously. The clamp 8 is arranged such that at this time, the current flowing through the clamp 8 is very small compared with the source current. Most of the current supplied to the load 6 therefore flows from the supply $V_{DD}$ and through the P channel transistor 2.

When $V_i$ is in a high logic state, the N channel transistor 4 is switched on and the P channel transistor 2 is switched off. The sink current initially flows out of the load 6 through the N channel transistor 4 to ground as described previously. The arrangement of the clamp 8 is such that when the source of the sink current is the load 6, the current flowing through the clamp 8 is very small compared with the sink current. Once the voltage at the load 6 reaches $V_{DD}-V_{CLAMP}$, the current flowing through the clamp 8 from the supply $V_{DD}$ increases towards the value of the sink current. This current flows because the clamp circuit attempts to keep the voltage at load 6 fixed at $V_{DD}-V_{CLAMP}$, hence no current can be drawn from the load 6. The current supplied by the supply $V_{DD}$ flows through the N channel transistor 4 to ground.

Referring to the control 9 of the PLC 10, this comprises a first and second NPN transistor 16 and 18 respectively connected in a current mirror arrangement. The collector of the first control transistor 16 is connected to the base of both the first and second control transistors 16 and 18 with the first control transistor 16 having its emitter connected to ground. The emitter of the second control transistor 18 is connected to ground and the base of the second control transistor 18 is connected to the base and collector of the first control transistor 16. The collector of the second control transistor 18 is connected to a first control resistor 20. The first control resistor 20 is additionally connected in series to a regulated voltage source $V_{REG}$.

The collector of the second control transistor 18 is connected to the input of an inverter 22. A third N channel field effect transistor 24 has its drain connected to $V_i'$ and the source of the N channel control field effect transistor 24 is connected to ground. The gate of the N channel control field effect transistor 24 is connected to the output of the inverter 22.

The current sensed by the second clamp transistor 14 flows from the collector of the second clamp transistor 14 into the collector of the first control transistor 16.

The control transistors 16 and 18 are connected in a current mirror arrangement. This means that the current flowing through the collector of the second control transistor 18 is the same as that which flows through the collector of the first control transistor 16. This current is the same as that which flows through the second clamp transistor 14 which, in turn, is the same as that which flows through the first clamp transistor 12. Accordingly, the current which flows in the first and second control transistors 12 and 14 is the same as that which flows through the voltage clamp 8.

The current flowing through the collector of the second control transistor 18 produces a voltage across the first control resistor 20. $V_{REG}$ is a regulated voltage source which, in this case, is 5 volts. When there is no voltage produced across the first control resistor 20 due to no current flowing through the collector of the second control transistor 18, the voltage at the input of the inverter 22 will be equal in magnitude to $V_{REG}$, in this case, 5 volts. This is because the only voltage seen by the input of the inverter 22 is, with no current flow, the voltage dropped across the first control resistor 20.

Once the current begins to flow through the clamp 8 and, therefore, through the collector of the second control transistor 18, the voltage at the input of the inverter 22 is the difference between the regulated voltage $V_{REG}$ and the product of the collector current through the second control transistor 18 and the resistance of the first control resistor 20.

In more detail, when $V_i$ is logic level low, the P channel transistor 2 is switched on and the N channel transistor 4 is switched off. The source current flows from the supply $V_{DD}$ through the P channel transistor 2 and into the load 6.

The current flowing through the clamp 8 from the supply $V_{DD}$ is only the leakage current which is very small The current mirror arrangement, using both the clamp transistors 12 and 14 accordingly, produces the same current flow through the collector of the first and second control transistors 16 and 18 as that which flows through the clamp B. This means, the current flowing through the collector of the second control transistor 18 is small compared with the source current flowing from the supply $V_{DD}$ through the clamp 8 and into the load 6. This therefore means that the current flowing through the collector of the second control transistor 18 and consequently the first control resistor 20 is also small. With the product of the resistance of the first control resistor 20 and the current flowing through the first control resistor 20 being small, the voltage at the input of the inverter 22 is substantially equal to that of the voltage $V_{REG}$. The output of the inverter 22 is logic level low so the N channel field effect transistor 24 is off and does not effect the state of transistor 4.

When $V_i$ is logic level high, the P channel transistor 2 is switched off and the N channel transistor 4 is switched on. The current flowing through the clamp initially is very small compared with the sink current as supplied by the load 6. The way in which the load 6 provides the sink current is discussed previously. Accordingly, the current flowing through the collector of the second control transistor 18 is small compared with the sink current flowing from the load 6. If the load reaches the value of $V_{DD}-V_{CLAMP}$. However, the sink current is sourced from the supply $V_{DD}$. As the current flowing through the clamp 8 increases because the supply $V_{DD}$ is beginning to supply the sink current, the current flowing through the collector of the second control transistor 18 increases. This increase in current means that the product of the current through the collector of the second control transistor 18 and the resistance of the first control resistor 20 increases so increasing the voltage developed across the first control resistor 20. As the voltage developed across the first control resistor 20 increases, the voltage at the input of the inverter 22 decreases. Once the current through the clamp 8 and hence the collector of the second control transistor 18 reaches a predetermined amount, in this case, 200 µA, the product of the current through the collector of the second control transistor 18 and the resistance of the first control resistor 20 is such that the voltage at the input of the inverter 22 is indicative of a logic low level. The output of the inverter 22 therefore changes state to a logic level high. It should be appreciated that, when the sink current is supplied by the load, there is no clamp current so the input to the inverter will be high, as when the p transistor 2 is on.

When the output of the inverter 22 is of a high logic level, the N channel control field effect transistor 24 is switched on. This means that the value of $V_i'$ as seen by the gate of the N channel transistor 4 drops to a logic level low regardless of the current value of either $V_i$ or $V_i'$. When the gate of the N channel transistor 4 drops to a logic level low, the N channel transistor 4 switches off thus stopping all current flow through the N channel transistor 4.

Once the sink current ceases from being supplied by the supply $V_{DD}$, the current flow through the clamp 8 also ceases. This means, by the previously described current mirror arrangement, the current which is fed into the control section 9 of the PLC 10 also ceases. This also means the current flowing through the collector of the second control transistor 18 also ceases due to the previously described current mirror arrangement. Accordingly, the voltage at the input of the inverter 22 increases because the product of the resistance of the first control resistor 20 and the second control transistor collector current decreases. Once the current flowing through the collector of the second control transistor 18 and hence the clamp 8 is such that the voltage seen at the input of the buffer 22 is indicative of a logic level high, the output of the inverter 22 will change state to be of a low logic level. This means that the gate of the N channel control field effect transistor 24 is a logic level low and so switches the N channel control field effect transistor 24 off. When the N channel control transistor 24 switches off, the N channel transistor 4 switches on. This will cause undesirable oscillation and accordingly current sink circuitry 11 is provided.

The current sink circuitry is added to ensure that while the sink current flows, either supplied by the load 6 or the supply $V_{DD}$. At least a predetermined amount of current flows through the current sink 11. This ensures that once the N channel transistor 4 is switched off because the load 6 is discharged sufficiently so that the sink current is being supplied by the supply $V_{DD}$, the N channel transistor 4 does not switch on again unnecessarily. This is achieved by the current sink circuitry 11 because it supplies a path for the predetermined level of current, in this case 200 µA, to flow to ground.

The current sink circuitry 11 comprises three N channel FET transistors. A first N channel sink transistor 26 has its drain attached to node B. Node B comprises a node where the output load 6, the output of the clamp 8, the source of the P channel transistor 2, the drain of the N channel transistor 4 and the drain of the N channel sink transistor 26 are all connected.

The source of the N channel sink transistor 26 is connected to ground. The gate of the first N channel sink transistor 26 is connected to the gate of a second N channel sink transistor 28 and the drain of the second N channel sink transistor 28. The drain of the second N channel sink transistor 28 is connected to the drain of a third N channel switch transistor 30 and by a current source to the supply $V_{DD}$. The source of the second N channel sink transistor 28 is connected to ground. The first and the second N channel sink transistor 26 and 28 are connected in a current mirror arrangement, in other words, the current which flows through the drain of the second N channel sink transistor 28 also flows through the drain of the first N channel sink transistor 26. The drain of the third N channel switch transistor 30 is connected to the drain of the second N channel sink transistor 28. The gate of the third N channel switch transistor 30 is connected to $V_i''$. $V_i''$ is the inverted logic of $V_i$ except where stated. The source of the third N channel switch transistor 30 is connected to ground. The geometry of the two N channel sink transistors 26, 28 is such that the first N channel sink transistor 26 draws a predetermined amount of current from source, in this case, the predetermined level being 200 Ma.

When $V_i$ is low, the supply $V_{DD}$ provides a source current which flows through the P channel transistor 2 and into the load 6 as previously described. The gate of the third N channel switch transistor 30 is at a logic level high and, therefore, switches on. This means that no current flows into the current sink circuitry 11 because the gates of transistors 26 and 28 are at ground potential through the third switch transistor 30. This means that all the source current flows through the P channel transistor 2 and into the load 6.

When $V_i$ is high, initially the load 6 supplies the sink current. As the gate voltage of the third N channel switch transistor 30 is at a logic level low, the third N channel switch transistor 30 switches off. Current will begin to flow in the current sink circuitry 11 from the load 6 through the current mirror arrangement of the first and second N channel sink transistors 26 and 28.

The sink current supplied by the load 6 flows through the N channel transistor 4 to ground as well the a predetermined amount, in this case, 200 µA, flowing through the current sink 11 to ground as described hereinbefore.

Once the load 6 is discharged sufficiently to reach the value of $V_{DD}-V_{CLAMP}$ so that the sink current is supplied by the supply $V_{DD}$, the N channel transistor 4 will switch off as described hereinbefore to stop the flow of unnecessary sink current from the supply $V_{DD}$, thus reducing power dissipation. $V_i''$, however, is maintained at a logic level low so the predetermined amount of current, in this case, 200 µA, still flows through the drain of the first N channel sink transistor 26. As the first and second N channel sink transistors 26 and 28 are connected in a current mirror arrangement, the current flowing through the drain of the second N channel sink transistor 28 is also 200 µA. Thus 200 µA flows through the third N channel switch transistor 30 to ground.

This current path to ground provided while $V_i''$ is low ensures that once the load 6 is discharged sufficiently such that the control circuitry 9 switches off the N channel transistor 4, the clamp 8 still can maintain a current flow of, in this case, 200 µA through the first clamp transistor 12. This means that the current flow through the second control transistor 18 is also 200 µA thus maintaining the output of the inverter 22 at a high logic level. This means that the N channel control field effect transistor 24 is on whenever the supply $V_{DD}$ is supplying the sink current, and so maintaining a reduced power dissipation.

The output Vo of the circuit can be used to control a transistor A or the like. Transistor A may be a high voltage field effect transistor. The transistor A may be used in a DC—DC converter.

It should be appreciated that transistors of the opposite polarity and/or of different types may be used in alternative embodiments of the invention. In alternative embodiments of the present invention, equivalent components may be used to achieve the same effects. For example if transistor A is a n type transistor, this method can be used to limit the source current when the output reaches the clamp voltage level, instead of the sink current.

What is claimed is:

1. A circuit for providing a signal for a load comprising:
   a first switch having a first and second state,
   a second switch having the first and the second state coupled to said first switch;
   a load connected to said first and second switches;
   protection circuitry for protecting the load from excessive voltage; and
   circuitry for switching said first switch;
   the circuit being arranged so that when said first switch is in the first state, a first current flows from the load to said first switch, said switching circuitry being arranged to switch said first switch to the second state when a voltage across the load reaches a predetermined value.

2. The circuit as claimed in claim 1, wherein said first switch receives a first control signal and said second switch receives a second control signal, the first and second control signals being arranged so that when said first switch is in the first state, said second switch is in the second state.

3. The circuit as claimed in claim 2, wherein said switching circuitry alters the first control signal received by the first switch.

4. The circuit as claimed in claim 1, wherein said protection circuitry comprises voltage clamp circuitry.

5. The circuit as claimed in claim 1, wherein said protection circuitry comprises means for detecting when the voltage across the load reaches the predetermined value when said first switch is in the first state.

6. The circuit as claimed in claim 5, wherein said protection circuitry is arranged to detect when a second current is provided to said first switch from a first voltage supply connected to said first switch.

7. The circuit as claimed in claim 6, wherein current mirror circuitry is provided to detect the second current.

8. The circuit as claimed in claim 5, wherein said protection circuitry provides a detection signal to said switching circuitry when it is determined that the voltage across the load reaches the predetermined value when said first switch is in the first state.

9. The circuit as claimed in claim 1, wherein said switching circuitry provides a control signal for controlling said first switch, said control signal having a third state and a fourth state, said control signal having the third state only when said first switch is in the first state and the voltage across the load reaches the predetermined value to thereby switch said first switch to the second state.

10. The circuit as claimed in claim 9, wherein said switching circuitry comprises an inverter to generate said control signal.

11. The circuit as claimed in claim 1, wherein retaining circuitry is provided for keeping said first switch in the second state while said second switch is still in the second state.

12. The circuit as claimed in claim 11, wherein said switching circuitry provides a control signal for controlling said first switch, said control signal having a third state and a fourth state, said control signal having the third state only when said first switch is in the first state and the voltage across the load reaches the predetermined value to thereby switch said first switch to the second state; and wherein said retaining circuitry is arranged to ensure that said control signal provided by said switching circuitry continues to have the third state if said second switch has the second state.

13. The circuit as claimed in claim 11, wherein said retaining circuitry is arranged to ensure that a minimum current flows through said switching circuitry.

14. The circuit as claimed in claim 11, wherein said retaining circuitry is arranged to ensure that a minimum current flows through said protection circuitry.

15. The circuit as claimed in claim 13, wherein said retaining circuitry is arranged to ensure that the minimum current flows only when said second switch is in the second state.

16. The circuit as claimed in claim 1, wherein said protection circuitry is provided for preventing the voltage across the load from exceeding a given threshold.

17. The circuit as claimed in claim 1, wherein said first switch and said second switch are of opposite conductivities.

18. The circuit as claimed in claim 1, wherein at least one of said first switch and said second switch comprises a transistor.

19. The circuit as claimed in 18, wherein said first switch is an n type transistor.

20. The circuit as claimed in claim 18, wherein said second switch is a p type transistor.

21. The circuit as claimed in claim 1, wherein said first and second switches are connected in series between first and second voltage supplies.

22. The circuit as claimed in claim 1, wherein the load comprises a further switch.

23. The circuit as claimed in claim 22, wherein said further switch is a transistor.

24. The circuit as claimed in claim 23, wherein said further switch is a p type transistor.

25. The circuit as claimed in claim 1, wherein the load is a capacitive load.

26. The circuit as claimed in claim 1, wherein the load is connected to a node between said first and second switches, a voltage at said node providing the signal for controlling the load.

27. The circuit as claimed in claim 1, wherein the circuit is arranged to provide a switching control signal.

* * * * *